(12) United States Patent
Högerl

(10) Patent No.: US 6,507,106 B1
(45) Date of Patent: Jan. 14, 2003

(54) SEMICONDUCTOR MODULE WITH A NUMBER OF SEMICONDUCTOR CHIPS AND A CONDUCTIVE CONNECTION BETWEEN THE SEMICONDUCTOR CHIPS BY FLEXIBLE TAPES

(75) Inventor: Jürgen Högerl, Regensburg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/577,060

(22) Filed: May 22, 2000

(51) Int. Cl.[7] .............................. H03L 23/34
(52) U.S. Cl. ............... 257/723; 257/724; 257/696; 257/773; 257/774; 257/780; 257/693
(58) Field of Search ................ 257/723, 724, 257/696, 773, 774, 780, 693

(56) References Cited

U.S. PATENT DOCUMENTS 5,224,023 A  6/1993  Smith et al.
5,646,446 A * 7/1997  Nicewarner et al. ........ 257/723

FOREIGN PATENT DOCUMENTS

EP  0 883 180 A2  12/1998
JP  06-334104      12/1994

* cited by examiner

Primary Examiner—David L. Talbott
Assistant Examiner—Kamand Cuneo
(74) Attorney, Agent, or Firm—Laurence A. Greenberg; Werner H. Stemer; Gregory L. Mayback

(57) ABSTRACT

A semiconductor module of the type having a number of semiconductor chips disposed on a chip carrier has at least a second subset of the semiconductor chips disposed above a first subset and conductive connections between the semiconductor chips disposed one above another. The improvement includes flexible tapes forming conductive connections between the first subset of semiconductor chips and the second subset of semiconductor chips. Two of the flexible tapes originate from the first subset and lead to the second subset. The two flexible tapes respectively extend from a contact-making side of the first subset around respectively mutually opposite side faces of the first subset to the second subset.

18 Claims, 4 Drawing Sheets

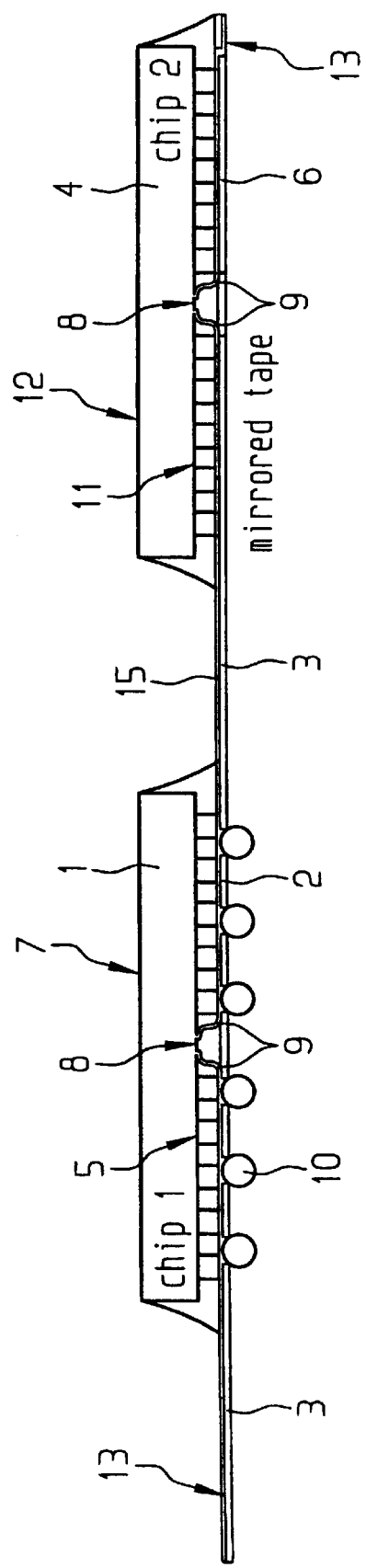
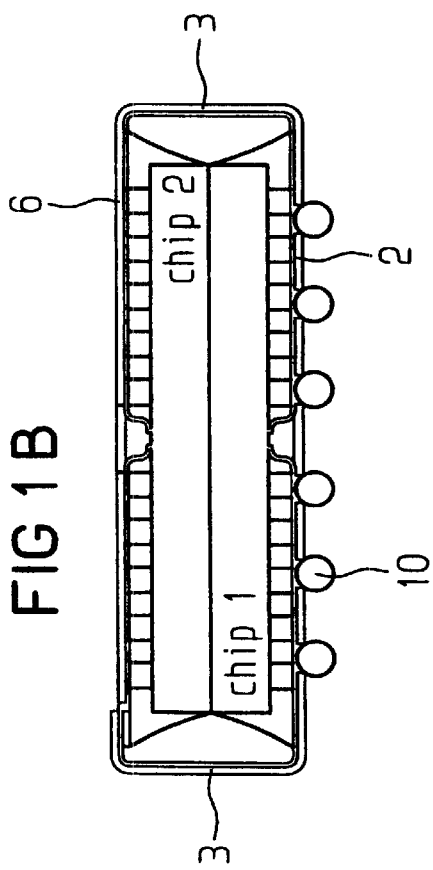

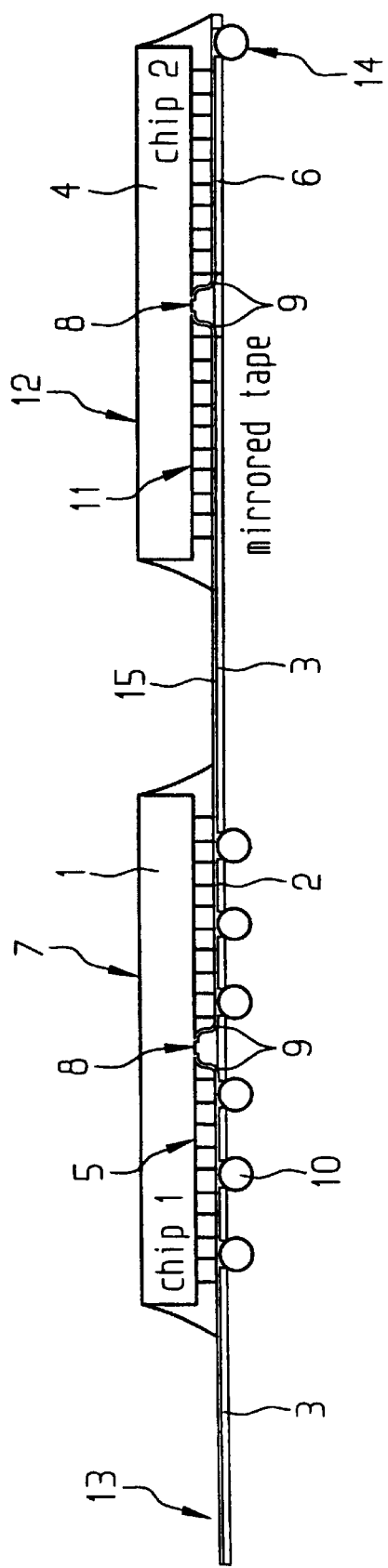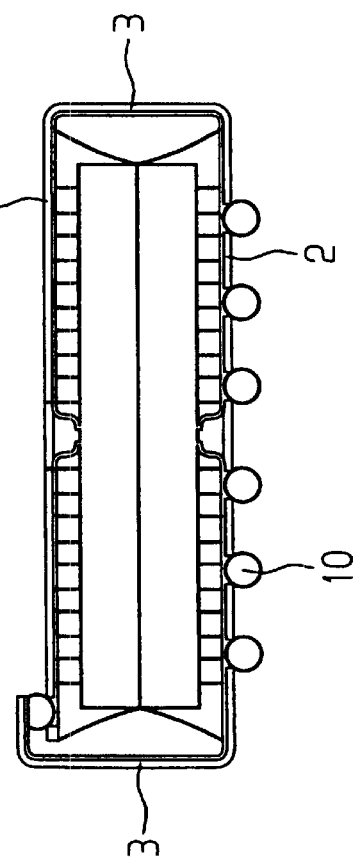

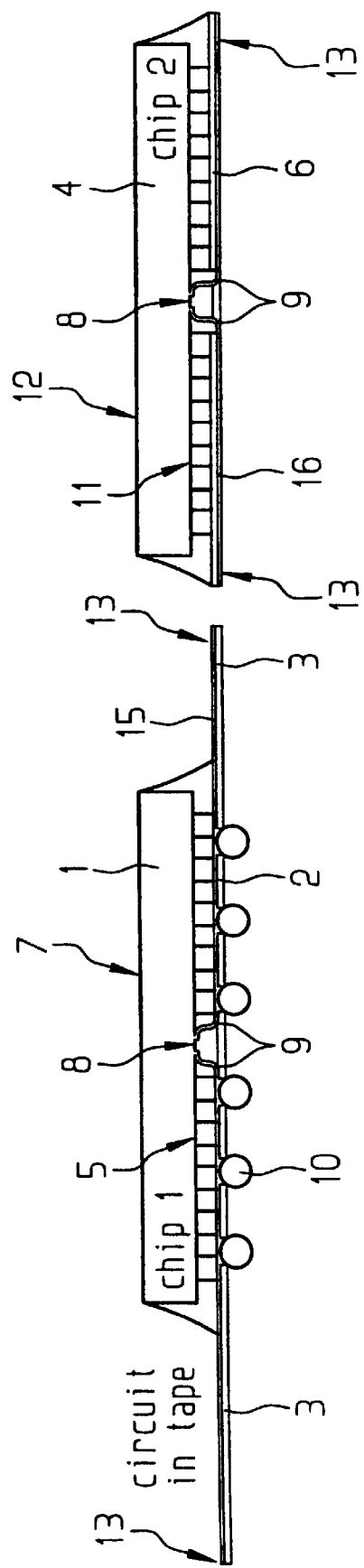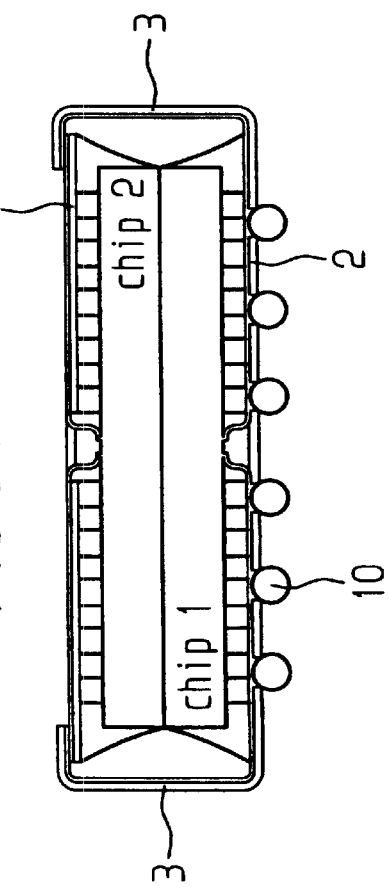
FIG 3A
FIG 3B

SEMICONDUCTOR MODULE WITH A NUMBER OF SEMICONDUCTOR CHIPS AND A CONDUCTIVE CONNECTION BETWEEN THE SEMICONDUCTOR CHIPS BY FLEXIBLE TAPES

BACKGROUND OF THE INVENTION

Field of the Invention

The invention lies in the field of semiconductors. The present invention relates to a semiconductor module with a number of semiconductor chips that are respectively disposed on a chip carrier. At least some of the semiconductor chips are disposed one above another. The configuration of the semiconductor module can have only two chips, for example, that are disposed one above another in a stack construction. However, the semiconductor module can also include a row of semiconductor chips that are disposed alongside one another, a second row of semiconductor chips being disposed in a stack configuration above the first row of semiconductor chips. A number of semiconductor chips or a number of rows of semiconductor chips one above another is also conceivable. Between the semiconductor chips there are respective case conductive connections, which are formed by flexible tapes with appropriate conductor runs.

Semiconductor modules are disclosed in the prior art, for example, in R. Leutenbauer et al., "Development of a Top-Bottom BGA", HDI, December 1998, pages 28 to 32. The article discloses that semiconductor chips are fitted either on a polyimide substrate or a rigid substrate, and a flexible tape is provided as a conductive connection between the substrate parts, which respectively act as chip carriers. Folding up the corresponding structure produces the semiconductor module, the conductive connection from one semiconductor chip on the first plane to a semiconductor chip disposed above it on the second plane respectively being led around one side of the semiconductor chip on the first plane. However, such a configuration proves to be disadvantageous because, if the conductive connection is led around on one side, the line paths between the interconnected terminals of the semiconductor chips disposed above one another turn out to have different lengths. Differing lengths leads to different signal propagation times between the corresponding terminals and, therefore, to problems during signal processing. In addition, such a configuration cannot be used for all types of semiconductor chips. This is true, because, for example, for semiconductor chips with chip contact terminals in a mid-axis of the semiconductor chip, with which contact is made by a beam lead method, the substrate has to be configured to be interrupted in the area of the mid-axis. Thus, a conductive connection, at least to one half of the semiconductor chip on the first plane, and a conductive connection to at least one half of the semiconductor chip on the second plane, can hardly still be produced by a conductive connection on one side.

SUMMARY OF THE INVENTION

It is accordingly an object of the invention to provide a semiconductor module with a number of semiconductor chips and a conductive connection between the semiconductor chips by flexible tapes that overcomes the hereinafore-mentioned disadvantages of the heretofore-known devices of this general type, that provides a semiconductor module with a number of semiconductor chips in which all types of semiconductor chips can be used, and that has the smallest possible difference in the signal propagation times between the chip contact terminals.

With the foregoing and other objects in view, in a semiconductor module of the type having a chip carrier and semiconductor chips disposed on the chip carrier, at least a second subset of the semiconductor chips to be disposed above a first subset of the semiconductor chips, the first subset having a contacting side and mutually opposing side faces, there is provided, in accordance with the invention, an improvement, including flexible tapes forming conductive connections between the first subset of semiconductor chips and the second subset of semiconductor chips, two of the flexible tapes originating from the first subset and leading to the second subset, the two of the flexible tapes respectively extending from a contacting side of the first subset around respective side faces of the first subset to the second subset.

In the improvement, two flexible tapes originating from the first subset of semiconductor chips lead to the second subset of semiconductor chips, the flexible tapes extending from a contact-making side of the first subset of semiconductor chips around respective mutually opposite side faces of these semiconductor chips to the second subset of semiconductor chips. In principle, however, more than two planes of semiconductor chips can be disposed one above another. For clarity, the present invention will be described using two planes of semiconductor chips.

The advantage of such a configuration is that the signal propagation times between the chip contact terminals of the semiconductor chips disposed one above another can be shortened significantly because the conductor runs are led around one of the two side faces of the semiconductor chips of the first plane. In addition, the problems of producing a conductive connection between the semiconductor chips are overcome. Such problems arise when the chip carrier has to have an interrupted configuration because of the configuration of the chip contact terminals, in order, for example, to be able to implement the making of contact through beam leads.

The chip carriers of the individual semiconductor chips can in principle be configured in any desired way. In a first development of the invention, the chip carrier of the first subset of semiconductor chips is a flexible tape. The tape includes both the chip carrier of the first subset of semiconductor chips and the conductive connections to the second subset of semiconductor chips around the side faces of the first subset of semiconductor chips. Thus, the semiconductor chips of the first plane can be disposed on a continuous tape, whose ends project on both sides of the semiconductor chip. After the first subset of semiconductor chips has been mounted on the flexible tape, the projecting ends can then be folded around the side faces of the semiconductor chip to produce a conductive connection to the semiconductor chips disposed above them.

In a further embodiment of the invention, the second subset of semiconductor chips is disposed on a separate chip carrier. The second plane of semiconductor chips can then be disposed above the first plane of semiconductor chips and, subsequently, by folding the projecting ends around the side faces of the first plane of semiconductor chips, a conductive connection to the second plane of semiconductor chips is produced.

In an alternative embodiment, the chip carrier of the first subset of semiconductor chips can also form the chip carrier of the second subset of semiconductor chips. As such, the chip carrier is configured as a continuous tape. Following the mounting of the first subset of semiconductor chips on the flexible tape, a projecting end remaining free on one side and on the other side of these semiconductor chips, the second subset of semiconductor chips can be mounted on the flexible tape at a certain distance. By folding up the entire configuration, the second subset of semiconductor chips can then be disposed in a stack configuration above the first subset of semiconductor chips, a first conductive connection between the two planes of semiconductor chips automatically being folded around the side faces of the semiconductor chips of the first plane. In order to produce the second conductive connection between the semiconductor chips, only the free, projecting end of the flexible tape is folded around the other side face of the semiconductor chips of the first plane, and conductively connected to the semiconductor chips of the second plane.

A development of the invention provides that a respective side of a semiconductor chip of the first subset opposite the contact-making side of the first subset adjoins a corresponding side of a semiconductor chip of the second subset opposite its contact-making side. Therefore, the semiconductor chips are disposed "back to back." As such, a flexible tape can be disposed around the entire module configuration as a chip carrier or conductive connection, which on one hand makes it easier to make contact with the semiconductor chips and, on the other hand, constitutes a protection for the entire module configuration, for example against mechanical influences.

The semiconductor chips can, in particular, be configured to provide chip contact terminals in a mid-axis of the contact making side of the semiconductor chips. The chip contact terminals are used to produce a conductive connection between the semiconductor chips and the respective chip carrier. The conductive connection can, in particular, be produced by a beam lead contacter.

In accordance with a concomitant feature of the invention, and, in order to make contact with the entire semiconductor module, module contact terminals can be provided on one side of the semiconductor module. These terminals can be disposed, for example, in the area of the contact-making side of the first subset of semiconductor chips. The module contact terminals are then connected to the corresponding chip contact terminals of the semiconductor chips through appropriate conductor runs on the chip carriers and by the conductive connections between the semiconductor chips and chip carriers. The module contact terminals can, for example, be configured as solder beads or pins.

Other features that are considered as characteristic for the invention are set forth in the appended claims.

Although the invention is illustrated and described herein as embodied in a semiconductor module with a number of semiconductor chips and a conductive connection by flexible tapes between the semiconductor chips, it is nevertheless not intended to be limited to the details shown because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1A is a cross-sectional view of a semiconductor module with a continuous, flexible tape as chip carrier and a conductive connection between the semiconductor chips according to the invention;

FIG. 1B is a cross-sectional view of FIG. 1A with the semiconductor module in a folded configuration;

FIG. 2A is a cross-sectional view of an alternative embodiment of the semiconductor module of FIG. 1A having a solder bead at the flexible tape;

FIG. 2B is a cross-sectional view of FIG. 2A with the semiconductor module in a folded configuration;

FIG. 3A is a cross-sectional view of an alternative embodiment of the semiconductor module of FIG. 1A with the flexible tape as chip carrier for the first semiconductor chip plane and a separate chip carrier for the second plane of semiconductor chips;

FIG. 3B is a cross-sectional view of FIG. 3A with the semiconductor module in a folded configuration.

DESCRIPTION OF THE PREFERRED EMBODIMENTS

Figure 4:
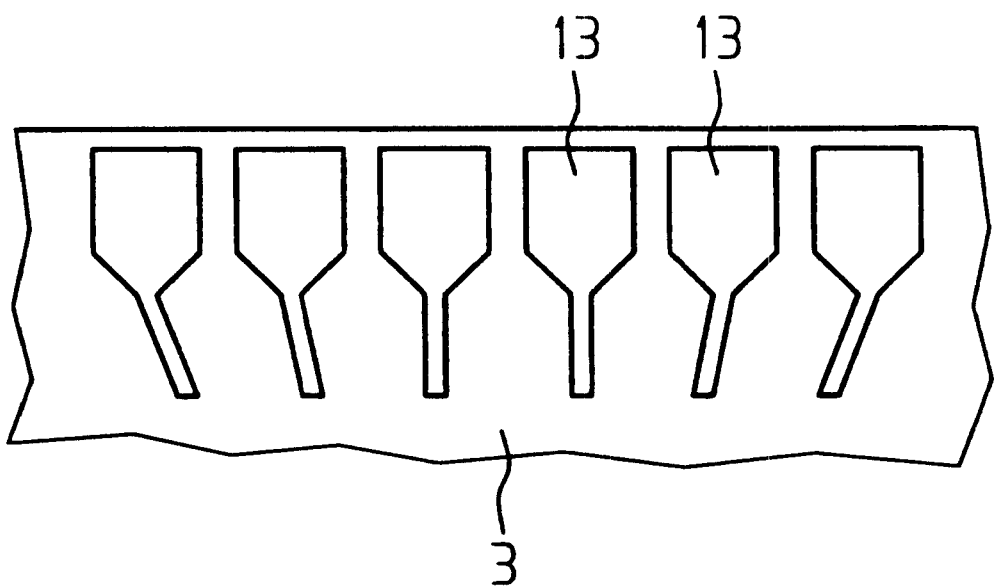
FIG. 4 is a diagrammatic, enlarged, partly broken away elevational view of the contact-making points of the flexible tape of FIGS. 1A, 2A, and 3A.

In all the figures of the drawing, sub-features and integral parts that correspond to one another bear the same reference symbol in each case.

Referring now to the figures of the drawings in detail and first, particularly to FIG. 1A thereof, there is shown a semiconductor module before it is finished by folding up the entire structure. FIG. 1B shows the finished semiconductor module in the folded-up state. In FIGS. 1 and 2, two semiconductor chips 1, 4 are mounted on a continuous flexible tape 3, for which the flexible tape 3 serves as chip carrier 2, 6 and for producing conductive connections 9 between the semiconductor chips and the corresponding chip-carrier sections 2, 6 of the flexible tape 3. The two semiconductor chips 1, 4 each have contact-making sides 5, 11 and rear sides 7, 12, which respectively lie opposite the contact-making sides 5, 11. The chip contact terminals for producing conductive connections 9 between the semiconductor chips 1, 4 and the chip carriers 2, 6 are disposed in a mid-axis 8 area of the semiconductor chips 1, 4. The conductive connections 9 are produced as beam lead contacts. At its ends, the continuous, flexible tape 3 has contact-making points 13 through which, when the semiconductor module is folded up, a conductive connection between the ends of the flexible tape 3 is produced. These contact-making points 13 can be seen in an illustration of a detail in FIG. 4.

In order to simplify the production of the conductive connections between the semiconductor chips, the second chip-carrier area 6 of the continuous flexible tape 3 is produced in mirror-symmetric fashion to the first chip-carrier area 2 of the flexible tape 3. The semiconductor chips 4 of the second plane are adapted appropriately.

After fitting the semiconductor chips 1, 4 to the continuous flexible tape 3, the semiconductor module is produced by simply folding up the entire configuration, the semiconductor chips 1, 4 resting with their sides 7, 12 on each other, so that a "back to back" configuration is produced. See FIG. 1B. If required, intermediate layers can be further provided between the semiconductor chips or between the sides 7, 12 of the chips, for example, specific heat-conducting layers which, during the operation of the semiconductor module, ensure that the heat produced between the semiconductor chips is carried away.

In order to make contact with the entire semiconductor module, module contact terminals 10 are provided on one side of the semiconductor module. The terminals 10 can be disposed, for example, in the area of the contact-making side 5 of the first subset of semiconductor chips 1. The module contact terminals 10 are then connected to the corresponding chip contact terminals of the semiconductor chips through appropriate conductor runs on the chip carriers and by the conductive connections between the semiconductor chips and chip carriers. The module contact terminals 10 can, for example, be solder beads or pins.

FIG. 2 shows an alternative for producing the conductive connection between the ends of the flexible tape 3. In FIG. 2, a solder bead 14 is provided at one end of the flexible tape 3 and, when the semiconductor module is folded up, a conductive connection is produced with corresponding contact-making points 13 at the other end of the flexible tape 3.

FIG. 3 shows an alternative embodiment, in which a continuous flexible tape 3 of the chip carrier 2 forms the first plane of semiconductor chips 1 and the conductive connections 3 to the second plane of semiconductor chips 4. The second plane of semiconductor chips 4 is respectively mounted on a separate chip carrier 6, which can likewise be configured as a flexible tape 3 or as any other desired chip carrier. It is advantageous for the flexible tape 3 that forms the chip carrier 2 to have a metallization 15 that, as also shown in the examples according to FIGS. 1 and 2, is disposed on that side of the flexible tape that faces the first plane or subset of semiconductor chips 1. The chip carrier 6 of the second level or subset of semiconductor chips 4 has, by contrast, a metallization layer 16 that is disposed on that side of the chip carrier 6 facing away from the semiconductor chips 4. The second plane of semiconductor chips 4 is then mounted on the first plane of semiconductor chips 1, once again, back to back and, if appropriate, with corresponding intermediate layers between the sides 7, 12 of the semiconductor chips 1, 4, that respectively lie opposite the contact-making sides 5, 11 of the semiconductor chips 1, 4. After the free ends 3 of the flexible tape have been folded up (the tape 3 also forming the chip carrier 2) the conductive connections between the semiconductor chips 1, 4 are produced through contact-making points 13 at the ends of the flexible tape and at the ends of the chip carrier 6.

The above-described semiconductor modules can be formed by just two semiconductor chips 1, 4 that are disposed one above another in a stack configuration. It is also possible to provide, in a first plane, a number of semiconductor chips 1 disposed alongside one another and, in a second plane, a corresponding number of semiconductor chips 4 disposed in a stack configuration above the first plane of semiconductor chips 1. More than just two planes of semiconductor chips 1, 4 one above another are also possible, each plane being formed either by individual semiconductor chips or by a row of semiconductor chips.

I claim:

1. In a semiconductor module of the type having a chip carrier and semiconductor chips disposed on the chip carrier, at least a second subset of the semiconductor chips to be disposed above a first subset of the semiconductor chips, the first subset having a contacting side and mutually opposing side faces, the improvement, comprising:

at least one flexible tape forming conductive connections between the first subset of semiconductor chips and the second subset of semiconductor chips, two portions of said flexible tape originating from the first subset and leading to the second subset, said two portions respectively extending from said contacting side of the first subset around respective side faces of the first subset to the second subset.

2. The semiconductor module according to claim 1, wherein the chip carrier for the first subset is a portion of said at least one flexible tape forming said conductive connections to the second subset.

3. The semiconductor module according to claim 2, wherein the chip carrier has a chip carrier part and the second subset of semiconductor chips is disposed on the chip carrier part.

4. The semiconductor module according to claim 2, wherein the chip carrier for the first subset forms a chip carrier for the second subset.

5. The semiconductor module according to claim 1, wherein the second subset has a contacting side and a side opposite the contacting side of the second subset, and the first subset has a side opposite the contacting side of the first subset and adjoining the side opposite the contacting side of the second subset.

6. The semiconductor module according to claim 5, wherein each of the semiconductor chips in the first subset has a side adjoining a side of a respective one of each of the semiconductor chips in the second subset.

7. The semiconductor module according to claim 5, wherein the contacting side of the first subset has a mid-axis, the contacting side of the second subset has a mid-axis, the first subset has chip contact terminals in the mid-axis formed to produce a conductive connection between the semiconductor chips of the first subset and the chip carrier of the first subset, and the second subset has chip contact terminals in the mid-axis formed to produce a conductive connection between the semiconductor chips of the second subset and the chip carrier of the second subset.

8. The semiconductor module according to claim 1, wherein the contacting side of the first subset has a mid-axis, the first subset has chip contact terminals in the mid-axis formed to produce a conductive connection between the semiconductor chips of the first subset and the chip carrier of the first subset, and the second subset has a contacting side with a mid-axis and chip contact terminals in the mid-axis formed to produce a conductive connection between the semiconductor chips of the second subset and the chip carrier of the second subset.

9. The semiconductor module according to claim 1, wherein, in the contacting side of the first subset of semiconductor chips, the chip carrier of the first subset of semiconductor chips has module contact terminals for making contact with the semiconductor module.

10. In a semiconductor module of the type having a chip carrier and semiconductor chips disposed on the chip carrier, at least a second subset of the semiconductor chips to be disposed above a first subset of the semiconductor chips, the first subset having a contacting side and mutually opposing side faces, the improvement, comprising:

two flexible tapes forming conductive connections between the first subset of semiconductor chips and the second subset of semiconductor chips, one of said flexible tapes originating from the first subset and leading to the second subset, said one flexible tape respectively extending from said contacting side of the first subset around respective side faces of the first subset to the second subset.

11. The semiconductor module according to claim 10, wherein the chip carrier for the first subset is a portion of at least one of the two flexible tapes forming said conductive connections to the second subset.

12. The semiconductor module according to claim 11, wherein the chip carrier has a chip carrier part and the second subset of semiconductor chips is disposed on the chip carrier part.

13. The semiconductor module according to claim 11, wherein the chip carrier for the first subset forms a chip carrier for the second subset.

14. The semiconductor module according to claim 10, wherein the second subset has a contacting side and a side opposite the contacting side of the second subset, and the first subset has a side opposite the contacting side of the first subset and adjoining the side opposite the contacting side of the second subset.

15. The semiconductor module according to claim 14, wherein each of the semiconductor chips in the first subset has a side adjoining a side of a respective one of each of the semiconductor chips in the second subset.

16. The semiconductor module according to claim 14, wherein the contacting side of the first subset has a mid-axis, the contacting side of the second subset has a mid-axis, the first subset has chip contact terminals in the mid-axis formed to produce a conductive connection between the semiconductor chips of the first subset and the chip carrier of the first subset, and the second subset has chip contact terminals in the mid-axis formed to produce a conductive connection between the semiconductor chips of the second subset and the chip carrier of the second subset.

17. The semiconductor module according to claim 10, wherein the contacting side of the first subset has a mid-axis, the first subset has chip contact terminals in the mid-axis formed to produce a conductive connection between the semiconductor chips of the first subset and the chip carrier of the first subset, and the second subset has a contacting side with a mid-axis and chip contact terminals in the mid-axis formed to produce a conductive connection between the semiconductor chips of the second subset and the chip carrier of the second subset.

18. The semiconductor module according to claim 10, wherein, in the contacting side of the first subset of semiconductor chips, the chip carrier of the first subset of semiconductor chips has module contact terminals for making contact with the semiconductor module.

* * * * *

UNITED STATES PATENT AND TRADEMARK OFFICE
CERTIFICATE OF CORRECTION

PATENT NO. : 6,507,106 B1  Page 1 of 1
DATED : January 14, 2003
INVENTOR(S) : Jürgen Högerl It is certified that error appears in the above-identified patent and that said Letters Patent is hereby corrected as shown below:

Title page,
Insert Item [30] as follows:
-- [30] Foreign Application Priority Data,
May 21, 1999 [DE] ……...199 23 467.1 --

Signed and Sealed this

Twenty-seventh Day of May, 2003

JAMES E. ROGAN
*Director of the United States Patent and Trademark Office*